(12) United States Patent
Azar

(10) Patent No.: US 8,063,485 B1
(45) Date of Patent: Nov. 22, 2011

(54) ELECTRONICS PACKAGE WITH INTEGRATED LUGS FOR COOLING ATTACHMENT

(75) Inventor: Kaveh Azar, North Quincy, MA (US)

(73) Assignee: Advanced Thermal Solutions, Inc., Norwood, MA (US)

( * ) Notice: Subject to any disclaimer, the term of this patent is extended or adjusted under 35 U.S.C. 154(b) by 591 days.

(21) Appl. No.: 12/163,531

(22) Filed: Jun. 27, 2008

(51) Int. Cl.
*H05K 7/20* (2006.01)

(52) U.S. Cl. ............... 257/727; 257/706; 257/E23.026

(58) Field of Classification Search .............. 257/706, 257/E23.086, 727
See application file for complete search history.

(56) References Cited

U.S. PATENT DOCUMENTS

| | | | |
|---|---|---|---|
| 5,019,940 A * | 5/1991 | Clemens | 361/723 |
| 5,313,099 A | 5/1994 | Tata et al. | |
| 5,323,845 A | 6/1994 | Kin-shon | |
| 5,329,426 A * | 7/1994 | Villani | 361/719 |
| 5,371,652 A | 12/1994 | Clemens et al. | |
| 5,384,940 A | 1/1995 | Soule et al. | |
| 5,430,610 A | 7/1995 | Hung | |
| 5,638,258 A | 6/1997 | Lin | |
| 5,640,305 A | 6/1997 | Smithers | |
| 5,791,403 A | 8/1998 | Chiou | |
| 5,889,653 A | 3/1999 | Clemens et al. | |
| 6,392,889 B1 | 5/2002 | Lee et al. | |
| 6,400,572 B1 | 6/2002 | Wu | |
| 6,424,530 B1 | 7/2002 | Lee et al. | |
| 6,477,049 B1 | 11/2002 | Lin | |
| 6,510,054 B1 | 1/2003 | Chen | |
| 6,538,891 B1 | 3/2003 | He et al. | |
| 6,563,213 B1 * | 5/2003 | Wong et al. | 257/727 |
| 6,826,054 B2 | 11/2004 | Liu | |
| 7,055,589 B2 | 6/2006 | Lee et al. | |
| 7,167,369 B1 | 1/2007 | Huynh et al. | |
| 7,180,744 B2 | 2/2007 | Chen et al. | |
| 7,203,066 B2 | 4/2007 | Lee et al. | |
| 7,283,361 B2 * | 10/2007 | Lee et al. | 361/704 |
| 2002/0176228 A1 | 11/2002 | Lin | |
| 2004/0047130 A1 | 3/2004 | Liu | |
| 2005/0083661 A1 | 4/2005 | Lee et al. | |

* cited by examiner

*Primary Examiner* — Benjamin Sandvik
*Assistant Examiner* — Krista Soderholm
(74) *Attorney, Agent, or Firm* — Lieberman & Brandsdorfer, LLC

(57) ABSTRACT

A board mounted integrated electronics package assembly is provided with one or more securing elements to attach a heat dissipating device directly to the package. The securing element(s) is located along a periphery of the package and anchors a base of the heat dissipating device to the package, thereby eliminating employment of a secondary heat dissipating material between the package and the heat dissipating device.

15 Claims, 15 Drawing Sheets

ELECTRONICS PACKAGE WITH INTEGRATED LUGS FOR COOLING ATTACHMENT

BACKGROUND OF THE INVENTION

1. Technical Field

This invention relates to an electronics package configured to receive and secure a cooling attachment thereto. More specifically, the invention relates to a grid assembly and lugs configured to receive and secure a heat dissipating device to the assembly without causing interference with the electronics package and ancillary components thereof.

2. Description of the Prior Art

A die, also known as a chip, is a piece of semiconducting material on which an integrated circuit is embedded. Electronic systems consist of a plurality of chips placed in a package known as a module or component. These package/components are then placed on a Printed Wiring Board (PWB). The combination of the component and the PWB is known in the art as printed circuit boards (PCBs). There are different types of components with drivers, packaging, including a Ball Grid Array (BGA), a Land Grid Array (LGA), and a Plastic Quad Flat Package (PQFP) that are microprocessors, memory chips, etc., that contain an integrated circuit (chip).

A ball grid array (BGA), a land grid assembly (LGA), and any electronic component, hereinafter referred to as a grid assembly (GA), are surface mount or through hole integrated circuit packages in which the chip is attached, soldered, or attached by other means to a printed circuit board. More specifically, the GA is an integrated electronic package. The GA is similar to a pin or ball grid array package in that the GA is used for the purpose of signal transmission or thermal attachment. The GA is placed on a PWB that carries copper pads in a pattern that matches the GA. GAs also have good electrical and thermal performance and occupy less space than leaded packages.

It is known in the art that integrated circuit components are getting larger to accommodate a greater number of functions on the associated device. However, a significant drawback with the larger integrated circuit components is the heat byproduct. The heat produced by these larger devices is not adequately removed by convection from the top surface of the package without the assistance of extra surface area such as that provided by a heat dissipating device, known in the art as a heat sink. One method of removing heat byproduct employs the use of a heat sink that is directly applied to the package. The heat sink may be secured to the device by a bonding process that employs an adhesive. Another aspect of attaching the heat sink to the device is through a clip. There are various known aspects for securing a heat sink to a heat producing device.

One aspect of securing a heat sink to a heat dissipating device utilizes the socket of the processor. Motherboards are sub-categorized by the type of processor sockets therein. The processor socket, also known as a CPU socket, is the connector on the motherboard that houses a central processing unit (CPU) and forms the electrical interface. Common processor sockets use a pin grid array where pins on the underside of the processor connect to holes in the processor socket. With respect to the socket, it is known in the art to integrate attachment elements for a heat dissipating device wherein the socket embraces the electronic components. However, by limiting the heat dissipating device attachment elements to the socket, the socket must be modified to accommodate the attachment elements. Furthermore, socketed components are less frequently used since the socket assembly, though convenient for field replacement, poses a thermal barrier for the device they house. It has become more comment for devices, whether CPU or Application Specific Integrated Circuit (ASIC) to be directly soldered to the PWB. Accordingly, there are limitations associated with the socket assembly that affects thermal performance of the socket and the associated chip.

Therefore, there is a need to separate the attachment element(s) of the heat dissipating device from the processor socket of the motherboard or the PWB that they are residing on. This separation will enable the heat dissipating device to embrace the attachment elements with respect to the device independent of the design of the processor socket or the PWB attachment.

SUMMARY OF THE INVENTION

This invention comprises an apparatus and system for securing a heat dissipating device directly to an integrated electronics package.

In one aspect of the invention, a board mounted integrated electronics package is provided with a chip in communication with supporting electronics mounted on a chip carrier having leads to provide electrical and thermal connectivity of the package to a printed circuit board. One or more securing elements are provided and protrude from a planar surface of the package to anchor a heat dissipating device to the package.

In another aspect of the invention, a board mounted electronic package is provided with a chip in communication with supporting electronics mounted on a chip carrier. The chip carrier includes leads to provide electrical and thermal connectivity to a printed circuit board. A first securing element is provided and protrudes from a planar surface of the package. The first securing element is configured to receive a second complementary securing element from a heat dissipating device. The first securing element together with the second securing element anchors the heat dissipating device to the package.

Other features and advantages of this invention will become apparent from the following detailed description of the presently preferred embodiment of the invention, taken in conjunction with the accompanying drawings.

BRIEF DESCRIPTION OF THE DRAWINGS

The drawings referenced herein form a part of the specification. Features shown in the drawings are meant as illustrative of only some embodiments of the invention, and not of all embodiments of the invention unless otherwise explicitly indicated. Implications to the contrary are otherwise not to be made.

DESCRIPTION OF THE PREFERRED EMBODIMENT

It will be readily understood that the components of the present invention, as generally described and illustrated in the Figures herein, may be arranged and designed in a wide variety of different configurations. Thus, the following detailed description of the embodiments of the apparatus, system, and method of the present invention, as presented in the Figures, is not intended to limit the scope of the invention, as claimed, but merely representative of selected embodiments of the invention.

Reference throughout this specification to "a select embodiment", "one embodiment", or "an embodiment" means that a particular feature, structure, or characteristic described in connection with the embodiment is included in at least one embodiment of the present invention. Thus, appearances of the phrases "a select embodiment", "in one embodiment," or "in an embodiment" in various places throughout this specification are not necessarily referring to the same embodiment.

The illustrated embodiments of the invention will be best understood by reference to the drawings, wherein like parts are designated by like numerals throughout. The following description is intended only by way of example, and simply illustrates certain select embodiments of devices, systems, and processes that are consistent with the invention as claimed herein.

The method, apparatus, and article of manufacture of the present invention provides valuable advantage over the prior art. According to the present invention, the attachment element(s) for the heat dissipating device area integrated into the electronics package, such as a ball grid array, and are independent of the processor socket of the motherboard.

Technical Details

In the following description, reference is made to the accompanying drawings that form a part hereof. The drawings show by way of illustration specific embodiments in which the invention may be practiced. It is to be understood that other embodiments may be utilized because structural changes may be made without departing from the scope of the present invention.

Figure 1:
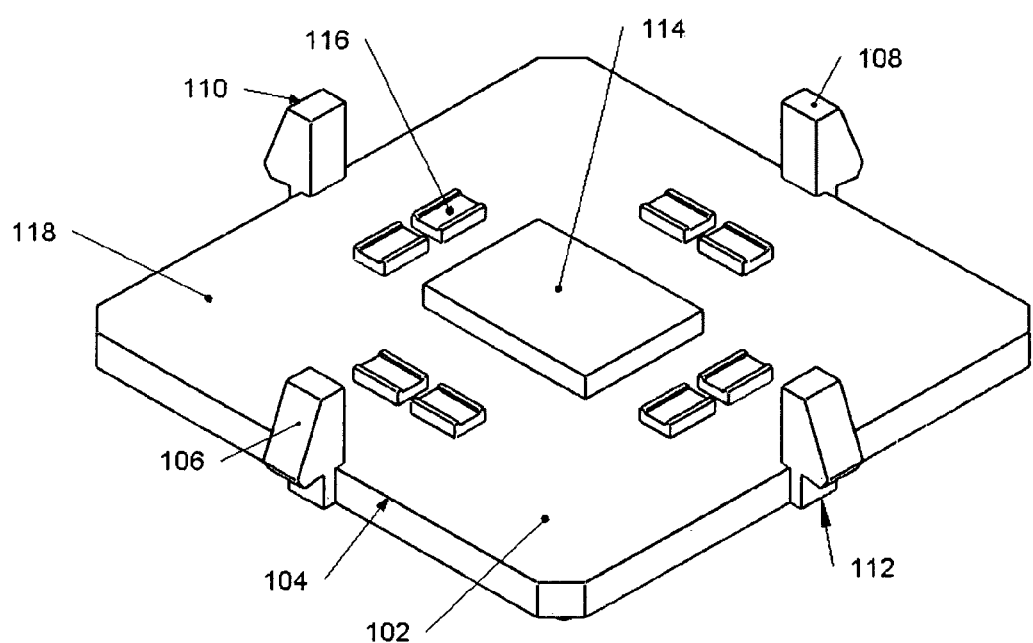
FIG. 1 is a diagram of a GA package with multiple securing elements to secure a heat dissipating device to the package, according to one embodiment of the invention and is suggested for printing on the first page of the issued patent.

FIG. 1 is a diagram (100) of a ball grid array (102) package, hereinafter referred to as a GA package. As shown, the GA package has a perimeter (104) with at least one chip (114) and one capacitor (116) mounted on a substrate (118) of the package (102). Multiple grip elements are provided to secure a detachable object to the package (102). In one embodiment, the grip elements are molded into the GA package. There are two sets of grip elements. A first set includes grip elements (106) and (108) which are disposed on opposite sides of the GA package (102). A second set includes grip elements (110) and (112) which are also disposed on opposite sides of the GA package (102), and are on different sides than grip elements (106) and (108). Although two sets of grip elements with two grip elements in each set are shown, the invention should not be limited to the quantity of sets or the quantity of elements in each set. In one embodiment, a larger quantity of grip elements or a smaller quantity of grip elements may be provided. The grip elements (106), (108), (110), and (112) are mechanical fastening elements that eliminate the requirement for a secondary element, such as a frame clip, epoxy, or mechanical attachment to the PWB, to secure a heat dissipating device to the heat producing elements.

Figure 2:
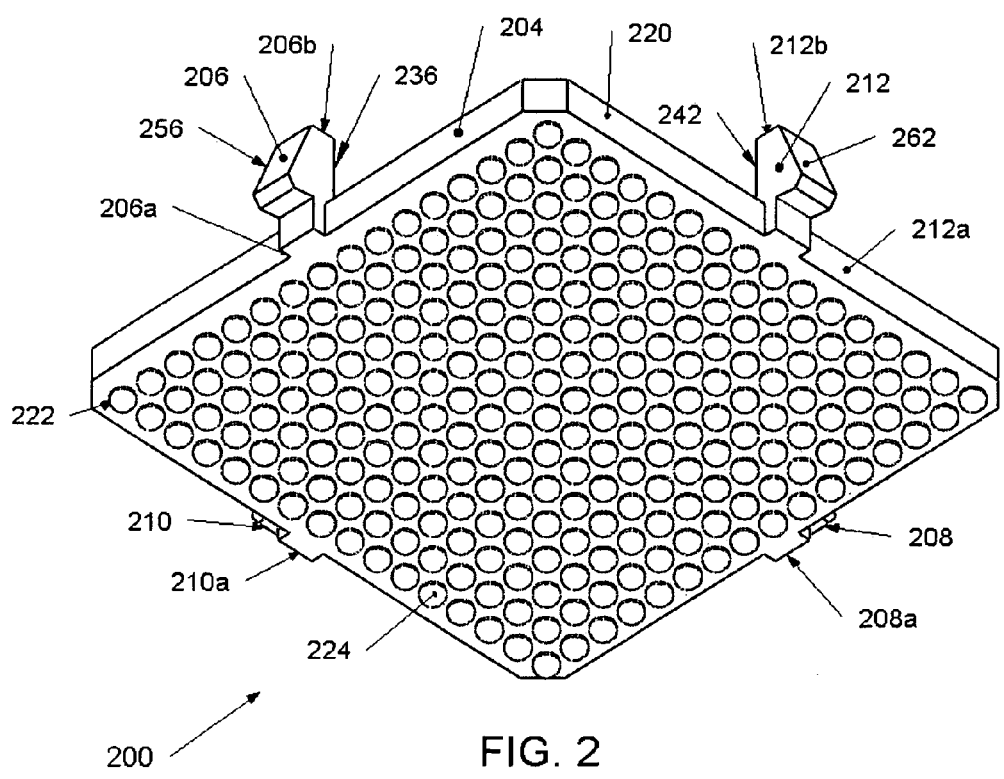
FIG. 2 is a bottom view of the GA package of FIG. 1.

FIG. 2 is a diagram (200) of a bottom view of the GA package of FIG. 1. As shown, the bottom surface (222) of the substrate (220) is a ball grid array. Each of the side grip elements (206), (208), (210), and (212) are mounted along the perimeter (204) of the package (200). As shown, the bottom surface (222) includes multiple balls of solder (224). The GA package (200) is placed on a printed circuit board that carries pads in a pattern that matches the solder balls. The assembly is then heated causing the solder balls to flow. Surface tension causes the molten solder to hold the package in alignment with the circuit board, at the correct separation distance, while the solder cools and solidifies. As shown, a bottom surface (206a), (208a), (210a), and (212a) of each of the side grip elements (206), (208), (210), and (212), respectively, is flush with the bottom surface (222) of the substrate (220). The flush alignment ensures that the side grip elements (206), (208), (210), and (212) do not cause any interference with the GA package. Opposite the bottom surfaces of the side grip elements is a top surface, identified herein as (206b), (208b), (210b), and (212b). The top surface of each side grip elements has an interior surface and an exterior surface. The exterior surface of each grip element serves as a securing surface to a heat dissipating device or a secondary attachment element.

The following description is specific to the side grip elements (206) shown in FIG. 2. However, the invention should not be limited to the specific aspects of the grip (206). In one embodiment, the side grip element (206) can have a different shape or profile than the elements of FIG. 2 that will best suit retention of the heat dissipating device and exertion of normal force on the device for the purpose of improved thermal performance. More specifically, the top of side grip element (206) has an interior surface (236) and an exterior surface (256), the top of side grip element (208) has an interior surface and an exterior surface, the top of side grip element (210) has an interior surface and an exterior surface, and the top of side grip element (212) has an interior surface (242) and an exterior surface (262). As shown herein, the interior surface of each of the side grip elements (216), (218), (220), and (222), is a vertical surface. However, the invention herein is not limited to the interior surface(s). In one embodiment, the interior surface(s) (216)-(222) may be vertical or near vertical, including a slanted angle with respect to a horizontal surface. Similarly, In one embodiment, the interior surfaces (216)-(222) are each flush with the perimeter (204) walls of the substrate (220). The alignment of the interior surfaces (216)-(222) with the substrate ensures that the functional element of the heat dissipating device sized to fit within the confines of the perimeter (204) without any functional changes to the fin field of the heat dissipating device.

Figure 3:
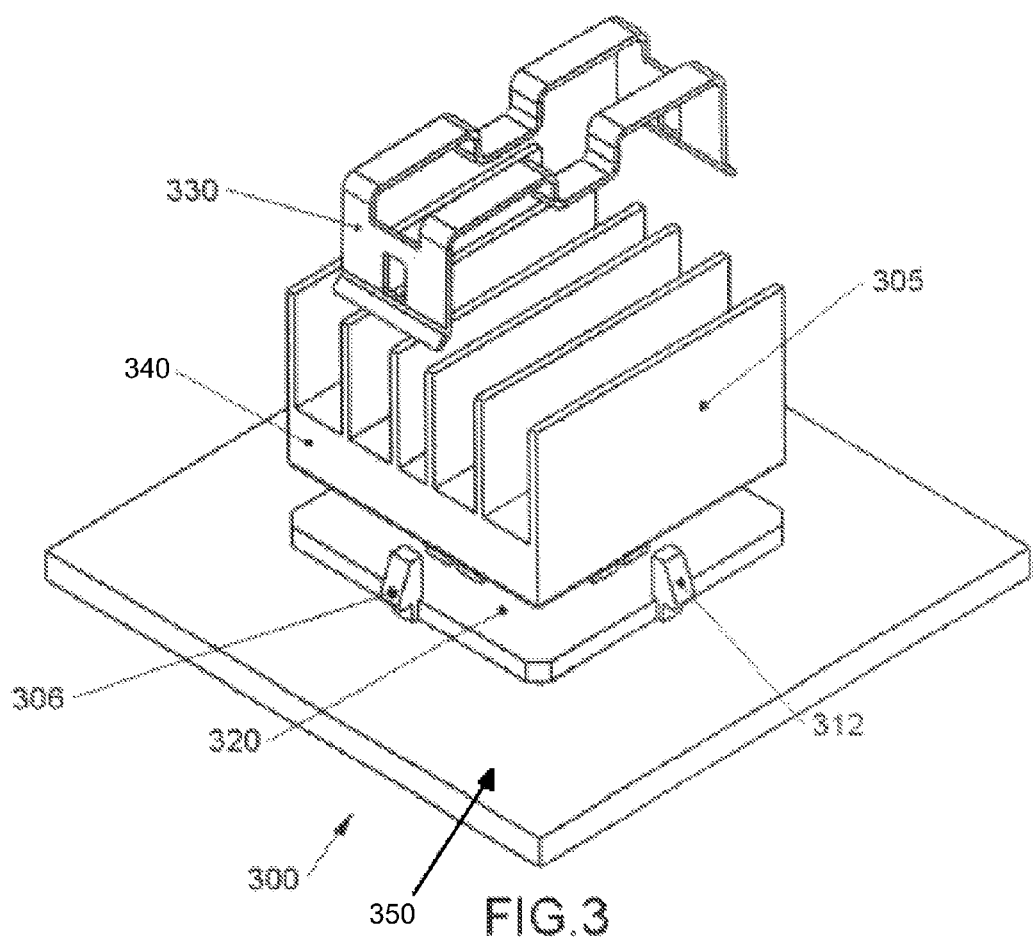
FIG. 3 is perspective view of the GA package of FIG. 1 receiving a heat dissipating device.
Figure 4:
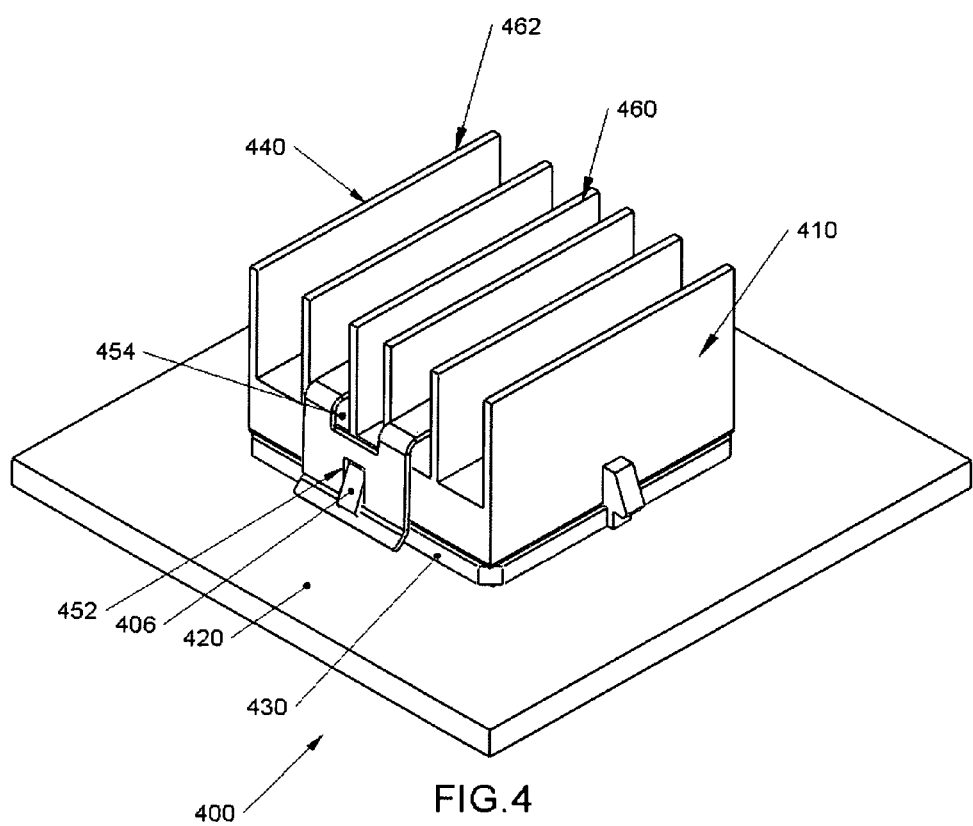
FIG. 4 is a perspective view the GA package of FIG. 1 with a heat dissipating device secured thereto.

The exterior surface of each of the side grip elements (216)-(222) has a non-planar profile. As shown in FIG. 2, the exterior surfaces (256)-(262) of each of the side grip elements (206)-(212) has a non-planar profile with the bottom surfaces (206a)-(212a) being planar with the plane of the perimeter (204) of the substrate (220). The non-planar profile is sized to receive a heat dissipating device, a clip, or alternative securing element without affecting any changes to a fin field of a heat dissipating device. FIG. 3 is a diagram (300) of a printed circuit board (350) having the substrate (320) with the GA (300) assembly mounted thereon, wherein a heat dissipating (305) device is being received by the GA assembly (300). As shown, the heat dissipating device (305) fits within the boundaries formed by the side grip elements (306) (312). Furthermore, as shown, a spring clip (330) is provided to fit over two opposite sides of the heat dissipating device (305), one side (340) is shown. FIG. 4 is a diagram (400) of a printed circuit board (420) with the GA assembly (430) mounted thereon, together with a clip (440) to secure the heat dissipating device (410) to the GA assembly (430). As shown, the clip (440) has two openings (452) and (454). A third opening (456) is on the opposite side of the clip (440) and is not visible in this view. The first and second openings (452) and (454), respectively, are sized to be received by the exterior surfaces of the side grip elements (406) and (408). The second opening (454) is sized to receive at least one fin (460) of the fin field (462) of the heat dissipating device (410). The structure and profile of the heat dissipating device (410) remains static, while the side grip elements and clip are modified to secure the heat dissipating device (410) to the GA assembly (400).

Figure 5:
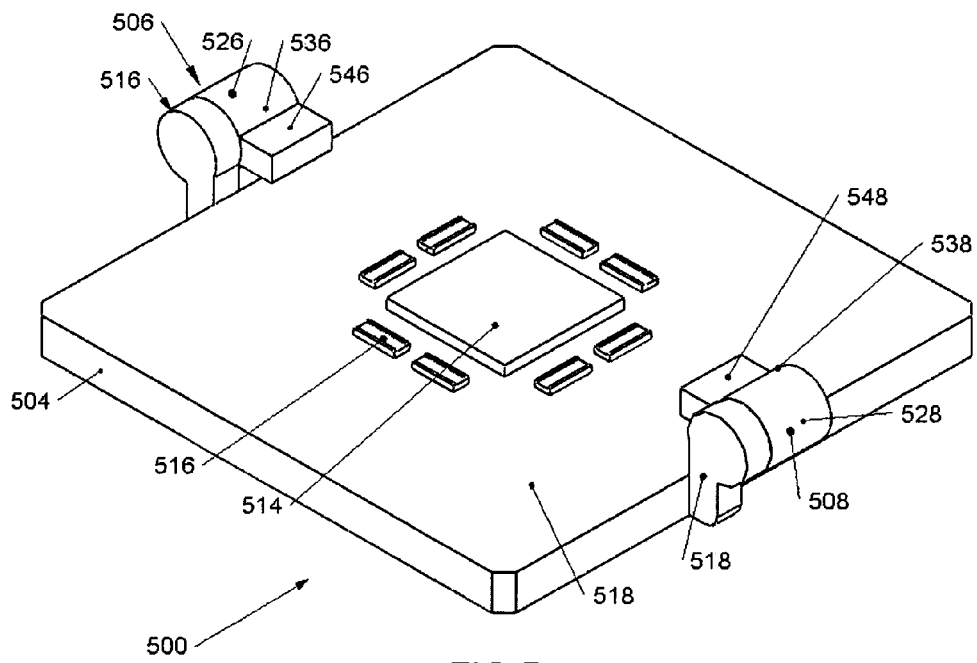
FIG. 5 is a diagram of another embodiment of a GA package with multiple securing elements to secure a heat dissipating device to the package.

In referenced to FIGS. 1-4, the GA package is provided with a set of spring loaded side grip elements to receive and secure a heat dissipating device to the GA assembly. FIG. 5 is a perspective view of a GA package (500) that includes a non-static side grip element. More specifically, as shown the GA package has a perimeter (504) with at least one chip (514) and one capacitor (516) mounted on a substrate (518) of the package (502). At least two grip elements (506) and (508) may be used to secure a detachable object to the package (500). In one embodiment, the grip elements (506) and (508) are molded into the GA package (500). The two grip elements (506) and (508) are shown on opposite sides of the perimeter (504). Although only one set of grip elements with two grip elements in the set are shown, the invention should not be limited to the quantity of sets or the quantity of elements in each set. In one embodiment, a larger quantity of grip elements or a smaller quantity of grip elements may be provided. The grip elements (506) and (508) are mechanical fastening elements that eliminate the requirement for a spring clip (not shown) to secure a heat dissipating device to the heat producing elements. The base of the heat dissipating device is sized to fit within the perimeter formed by the grip elements (506) and (508). However, the area formed by the fin field of the heat dissipating device is not limited to the footprint of the planar area of the base. In one embodiment, the fin field and the base of the heat sink may extend beyond the profile of the base of the heat dissipating device depending upon the cooling requirement.

Each of the grip elements (506) and (508) are divided into two segments, a first segment referred to as (516) and (526) for the first and second grip elements, respectively, and a second segment referred to as (518) and (528) for the first and second grip elements, respectively. Accordingly, each grip element is comprised of two adjacently mounted segments. The first segments (516) and (518) of each grip element (506) and (508), respectively, are stationary and remain fixed to the GA assembly (500). The second segments (526) and (528) of grip elements (506) and (508), respectively, are mounted adjacent to the first segments (516) and (518), respectively via a securing element (not shown). In one embodiment, the securing element may be in the form of a shaft and each of the second segments (526) and (528) may rotate about an axis of the shaft. Similarly, in one embodiment, the second segments (526) and (528) are spring loaded with a position of the second segment aligned with the respective first segment when the second is in a rest position. The securing element together with the elasticity enable the second grip element portions (526) and (528) to rotate about the first grip elements (516) and (518), respectively, and to maintain a rest position without torsion in the respective embedded spring element.

Each of the second grip element portions (526) and (528) has an interior surface (536) and (538) that faces the opposite grip element (506) and (508), respectively. In other words, the interior surface (536) of grip element (506) faces the interior surface (538) of grip element (508) on an opposite side of the perimeter of the GA assembly (500). In one embodiment, the interior surface (536) is linearly arranged with interior surface (538) across the perimeter. Alternatively, in one embodiment, the interior surface (536) is not linearly arranged with interior surface (538). Each interior surface (536) and (538) is a planar surface with a perpendicular projection (546) and (548), respectively. The 546 and 548 may have different shapes that will best suit retention of the heat dissipating device and exertion of normal force on the device for the purpose of improved thermal performance. The projections extend from the planar surface (536) and (538), respectively, to the interior area of the BGA assembly.

As a heat dissipating device is placed with the BGA package, the projections (546) and (548) function to hold the heat dissipating device in a stationary position, as explained in detail below. Initially, to accommodate a heat dissipating device, one or more of the second grip element portions (526) and (528) are rotated in a direction away from the BGA device along a radius of rotation. Movement of the second grip elements is facilitated by both the securing element and the internal torsion of the spring of the respective second segment. Rotation of the respective second segment exerts a force on the associated spring. While the second grip element portions are in the rotated position, a heat dissipating device is placed on the planar surface of the BGA assembly. Once the heat dissipating device is in place, pressure on the second grip elements (526) and (528) is removed to allow the grip elements (526) and (528) to return to their upright and stationary positions. The properties of the spring will return the second segment to its rest position, as shown in FIG. 5.

Figure 6:
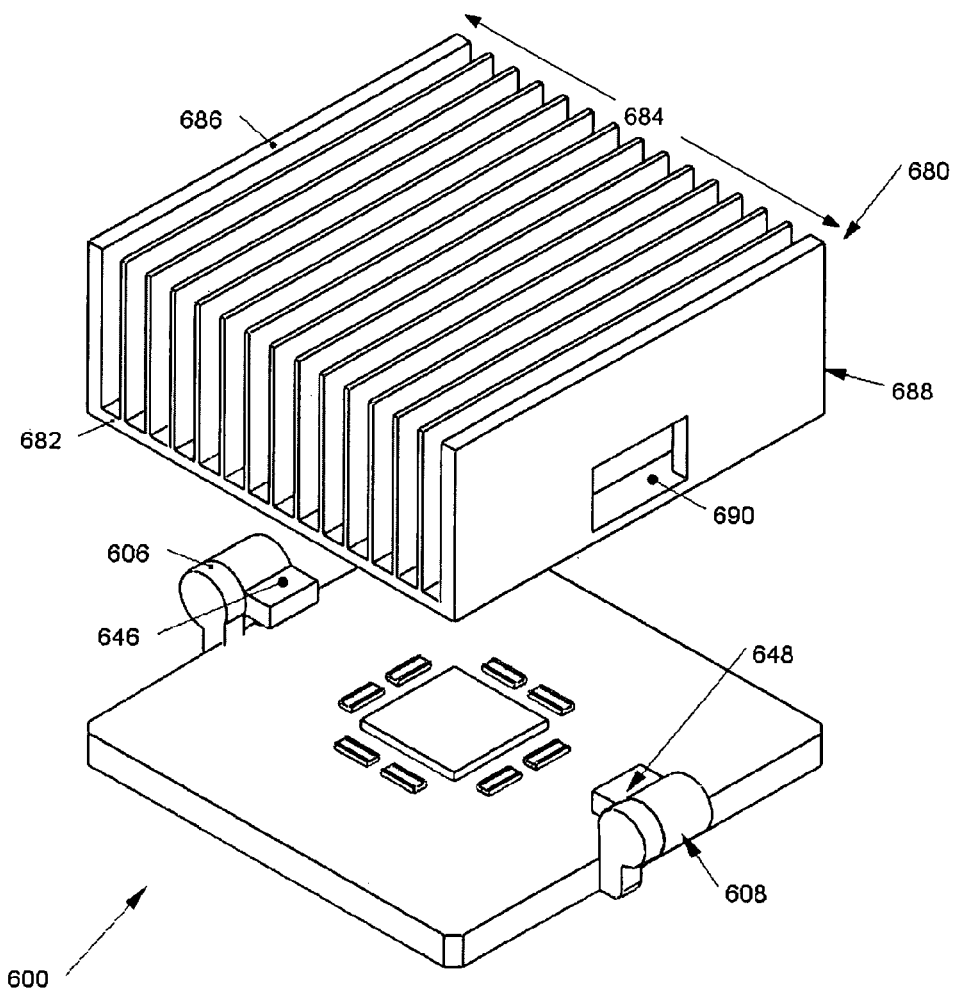
FIG. 6 is a perspective view of the GA package of FIG. 5 receiving a heat dissipating device.

FIG. 6 is a diagram (600) of a perspective view the GA assembly in the process of receiving a heat dissipating device (680). As shown, the heat dissipating device (680) has a base (682) with a fin field (684) extending perpendicular to the base. There are two end fins in the fin field, (686) and (688). Each of the end fins (686) and (688) includes an aperture (690). The aperture is sized to receive the perpendicular (646) and (648) of each side grip element. As shown, the heat dissipating device (680) fits within the boundaries formed by the side grip elements (606) and (608). In one embodiment, a spring clip (not shown) may be employed to fit over two opposite sides of the heat dissipating device (680). A clip functions to add an element for securing the heat dissipating device (680) to the substrate, if necessary.

Figure 7:
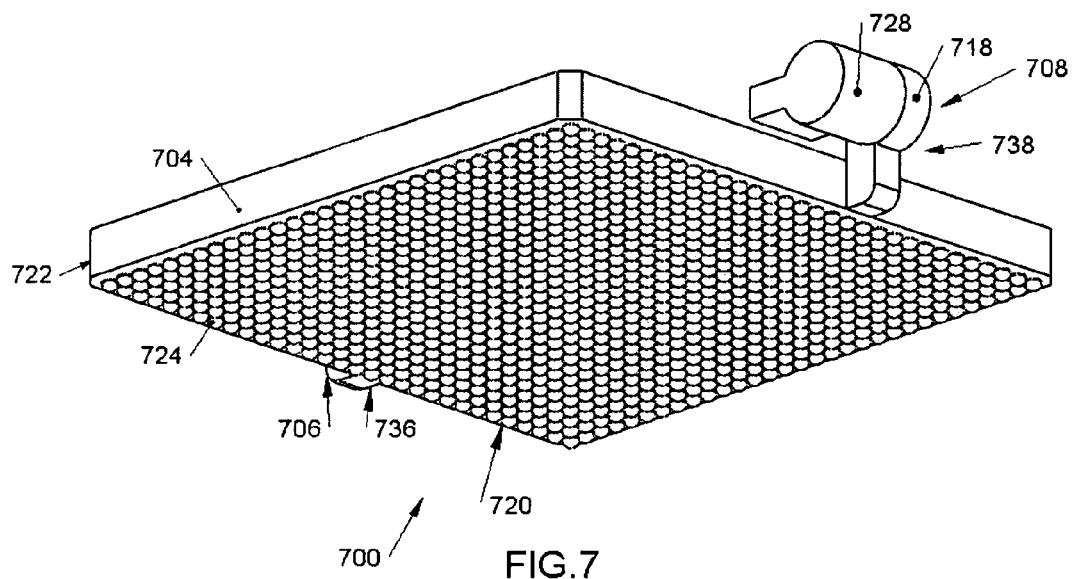
FIG. 7 is a bottom view of the GA package of FIG. 5.

FIG. 7 is a diagram (700) of a bottom view of the GA package of FIG. 5. As shown, the bottom surface (722) of the substrate (720) is a ball grid array. Each of the side grip elements (706) and (708) are mounted along the perimeter (704) of the package (700). As shown, the bottom surface (722) includes multiple balls of solder (724). The GA package (700) is placed on a printed circuit board that carries copper pads in a pattern that matches the solder balls. The assembly is then heated causing the solder balls to soften. Surface tension causes molten solder to hold the package in alignment with the circuit board, at the correct separation distance, while the solder cools and solidifies. As shown in FIG. 5, each of the grip elements has a first segment and a second segment. In this view the first and second segments (718) and (728) of the second grip element (708) is shown, with the second segment (728) being the rotatable segment. The first segment of each grip element has a bottom surface (736) and (738). The bottom surfaces (736) and (738) of each of the side grip elements (706) and (708) is flush with the bottom surface (722) of the substrate (720). The flush alignment ensures that the side grip elements (706) and (708) do not cause any interference with the GA package (700).

Figure 8:
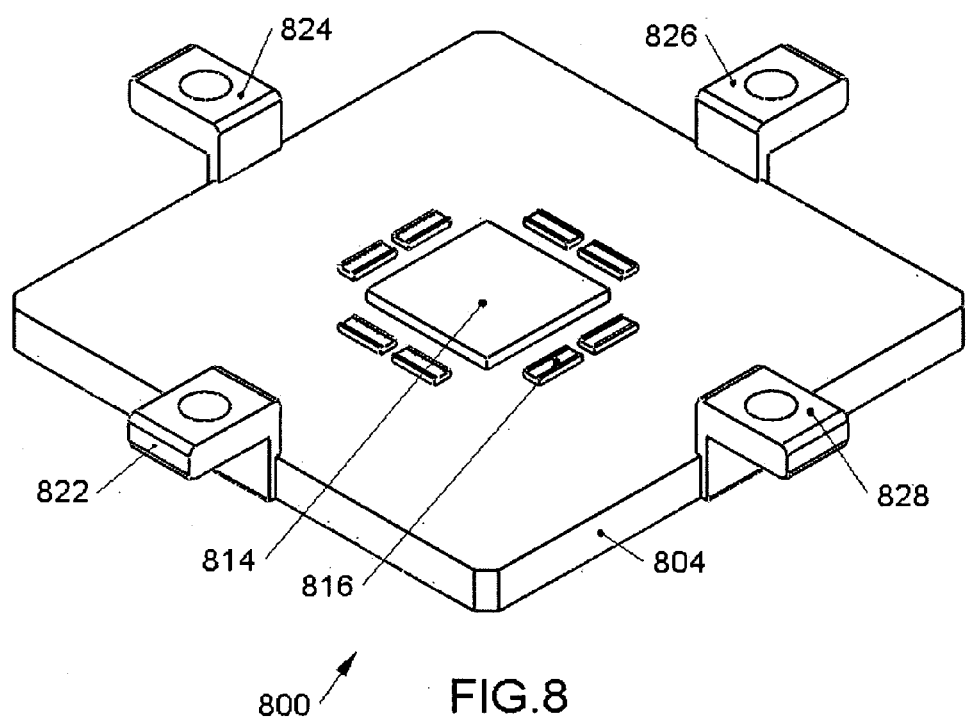
FIG. 8 is a diagram of yet another embodiment of a GA package with multiple securing elements to secure a heat dissipating device to the package.

FIG. 8 is a perspective view of a ball grid array package (800), hereinafter referred to as GA package with modified side securing elements. As shown, the GA package (800) has a perimeter (804) with at least one chip (814) and one capacitor (816) mounted on a substrate (818) of the package (800). The GA package perimeter (804) has multiple securing elements (822), (824), (826), and (828) to secure a detachable object to the package. In one embodiment, the grip elements are molded into the GA package (800). As shown, the perimeter (804) resembles a parallelogram with a single securing element on each side of the perimeter. In one embodiment, there may be two oppositely mounted securing elements, or multiple securing elements on each side of the perimeter. As shown herein, a first set includes securing elements (822) and (826) are disposed on opposite sides of the GA package (800). A second set includes securing elements (824) and (828) disposed on opposite sides of the GA package (800), and on different sides than securing elements (822) and (826). Although two sets of securing elements with two securing elements in each set are shown, the invention should not be limited to the quantity of sets or the quantity of elements in each set. In one embodiment, a larger quantity of grip elements or a smaller quantity of grip elements may be provided.

Each of the securing elements (822), (824), (826), and (828) are configured to receive a mechanical fastening element to secure a heat dissipating device (not shown) to the heat producing elements. More specifically, the base of a heat dissipating device (not shown) may be sized to fit within the perimeter (804) of the GA package (800) formed by the securing elements (822)-(828) or it can extend beyond the perimeter of the package (805).

Figure 9:
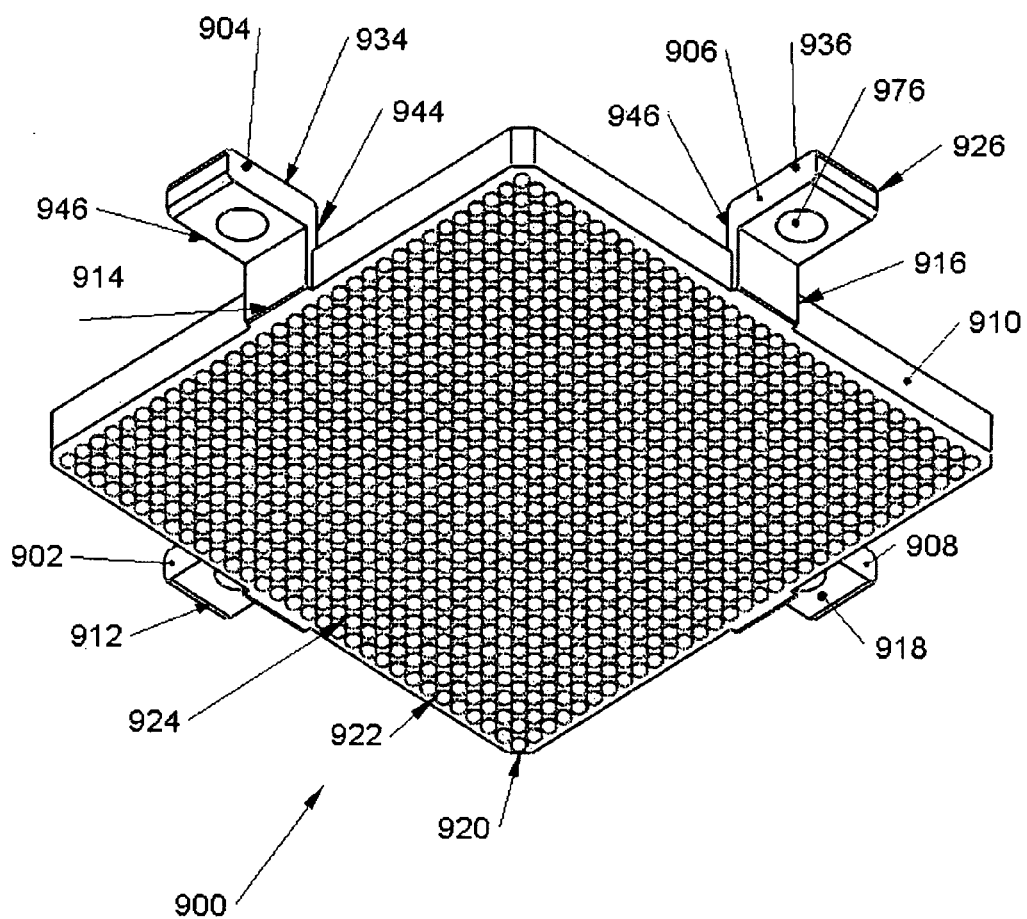
FIG. 9 is a bottom view of the GA package of FIG. 8.

FIG. 9 is a diagram (900) of a bottom view of the GA package of FIG. 8. As shown, the bottom surface (922) of the substrate (920) is a ball grid array. Each of the side securing elements (902)-(908) are mounted along the perimeter (910) of the package (900). As shown, the bottom surface (922) includes multiple balls of solder (924). The GA package (900) is placed on a printed circuit board that carries copper pads in a pattern that matches the solder balls. The assembly is then heated causing the solder balls to soften. Surface tension causes molten solder to hold the package in alignment with the circuit board, at the correct separation distance, while the solder cools and solidifies. As shown, a bottom surface (912), (914), (916), and (918) of each of the side securing elements (902), (904), (906), and (908), respectively, is flush with the bottom surface (922) of the substrate (920). The flush alignment ensures that the side securing elements (902)-(908) do not cause any interference with the GA package.

Opposite the bottom surfaces of the side securing elements is a top surface, identified and shown herein with respect to the two securing elements (904) and (906) as (934) and (936), respectively. For each securing element, a vertical wall extends from a bottom surface to a top surface. As shown in FIG. 9, securing element (904) has a vertical wall (944) and securing element (906) has a vertical wall (946). The vertical walls contribute to formation of a frame around the perimeter (910) to ensure that the mechanical securing elements do not infringe within the planar area of the GA (900) configured to receive a heat dissipating device.

In reference to each of the securing elements (902)-(908), a horizontal planar surface extends from an interior surface facing the substrate to an exterior surface facing away from the substrate of each respecting securing element (902)-(908). An aperture is provided on each horizontal planar surface of each securing element. As shown, an aperture (974) is provided for securing element (904) and an aperture (976) is provided for securing element (906). Each aperture (974) and (976) is sized to receive a securing element without affecting any changes to the fin field.

Figure 10:
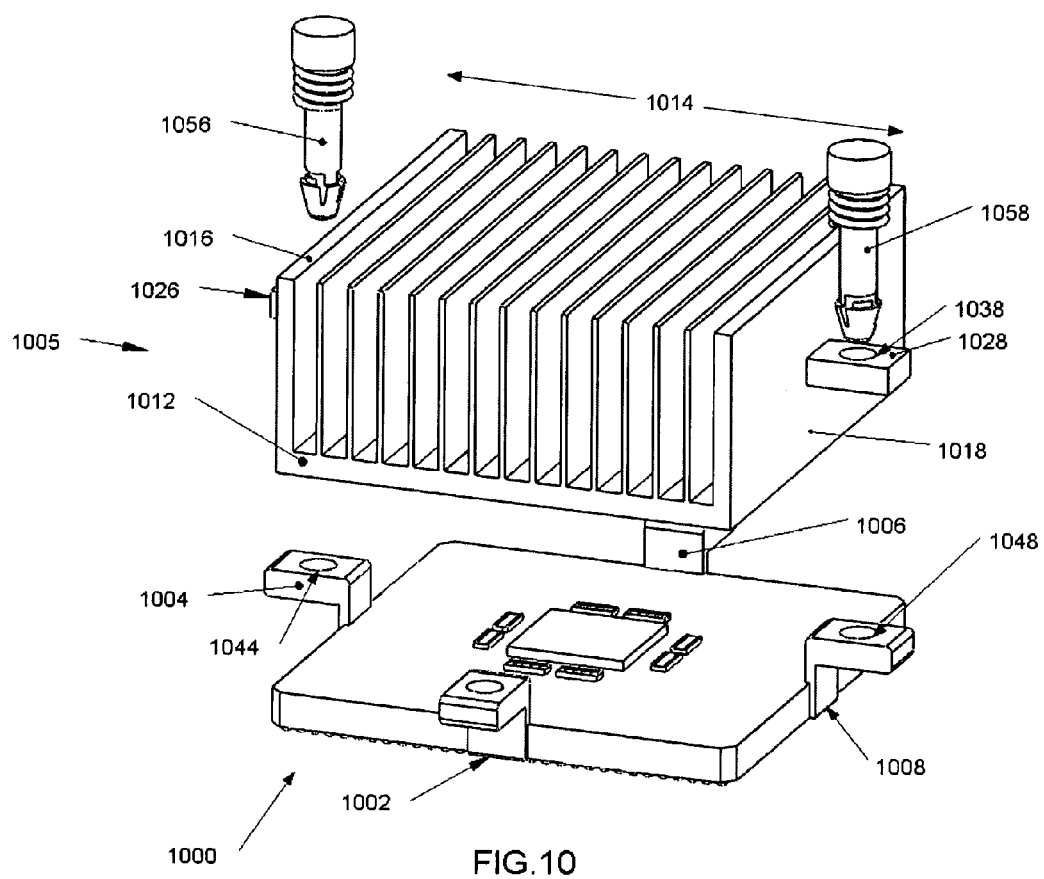
FIG. 10 is a perspective view of the GA package of FIG. 8 receiving a heat dissipating device.

FIG. 10 is a diagram of a GA assembly (1000) with the securing elements of FIG. 9 mounted thereon, and a heat dissipating device (1005) received by the GA assembly (1000). As shown, the heat dissipating device (1005) fits within the boundaries formed by the side grip elements (1002), (1004), (1006), and (1008) but can extend beyond the perimeter of the package (1000). Furthermore, as shown, the heat dissipating device (1005) includes a base (1012) and a fin field (1014) with two exterior fins (1016) and (1018). Each of the exterior fins (1016) and (1018) includes an abutment (1026) and (1028), respectively, which is perpendicularly mounted thereto and extends away from the fin field. Furthermore, each abutment has an aperture. In this view, only the aperture (1028) for abutment (1038) is shown. When the heat dissipating device is properly placed within the boundaries formed by the side grip elements (1002)-(1008), the apertures of the heat dissipating device align with the apertures (1044) and (1048) of the respective securing element (1004)-(1008), respectively. In one embodiment, the remaining two securing elements (1002) and (1006) do not align with the exterior fins (1012) and (1018) of the fin field (1014), and such do not receive a complementary abutment to receive a securing element. Once the alignment of aperture is completed, a first securing element (1056) is placed through both the aperture mounted to the exterior fin (1016) and the aperture (1044) of securing element (1004). In addition, a second securing element (1058) is placed through aperture (1038) and (1048) of the heat dissipating device and the GA assembly, respectively. A variety of securing elements may be employed to be placed through the aligned apertures, including a push pin, a screw, a screw with a spring, and combinations thereof. Accordingly, the invention should not be limited to a specific structure of a securing element, as long as it is configured to be received by the aligned apertures.

Figure 11:
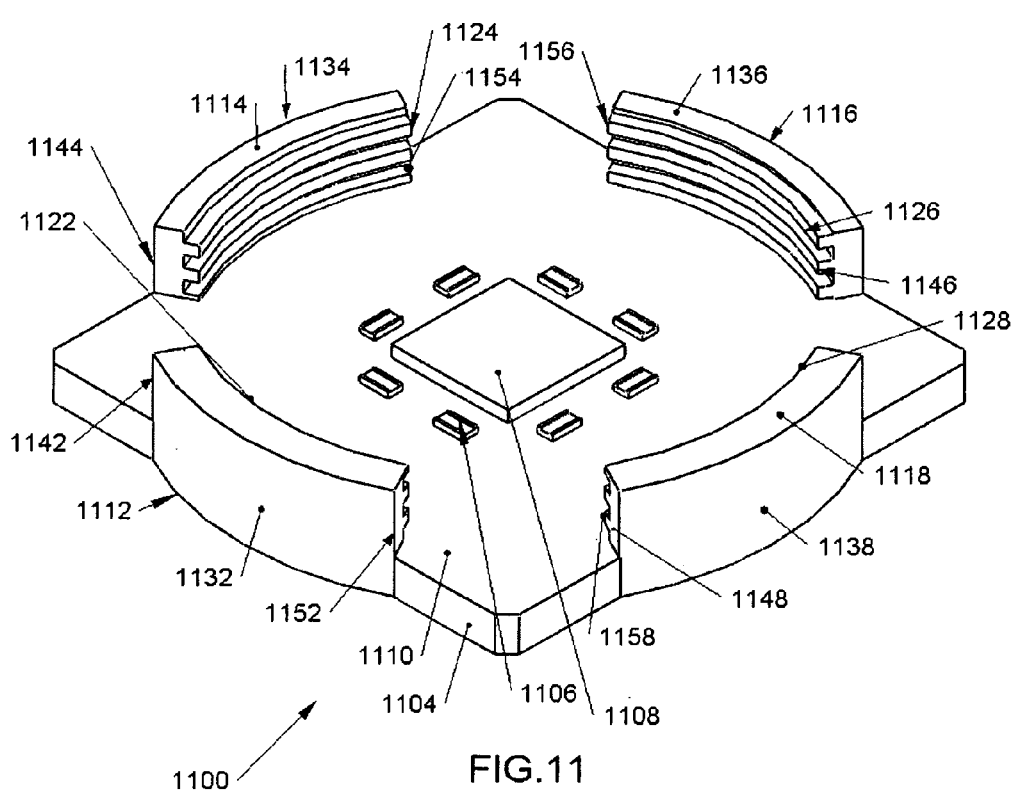
FIG. 11 is a diagram of an even further embodiment of a GA package with multiple securing elements to secure a heat dissipating device to the package.

FIG. 11 is a perspective view of a modified GA assembly (1100) to receive a heat dissipating device. The GA assembly (1100) has a perimeter (1104) with at least one chip (1108) and one capacitor (1106) mounted on a substrate (1110) of the assembly (1100). As shown, the GA assembly (1100) has a perimeter (1104) with multiple securing elements (1112), (1114), (1116), and (1118) to secure a detachable object to the package. In one embodiment, the securing elements are molded into the GA assembly. As shown, the perimeter (1104) resembles a parallelogram with a single securing element on each side of the perimeter. In one embodiment, there may be two oppositely mounted securing elements, or multiple securing elements on each side of the perimeter. As shown herein, there is a single securing element along each side of the perimeter (1110). A first set includes securing elements (1112) and (1116) which are disposed on opposite sides of the GA assembly (1100). A second set includes securing elements (1114) and (1118) disposed on opposite sides of the GA package (1100), and on different sides than securing elements (1112) and (1116). Although two sets of securing elements with two securing elements in each set are shown, the invention should not be limited to the quantity of sets or the quantity of elements in each set. In one embodiment, a larger quantity of grip elements or a smaller quantity of securing elements may be provided.

Each of the securing elements (1112), (1114), (1116), and (1118) are configured with a convex shape with an interior wall and an exterior wall. More specifically, securing element (1112) has interior wall (1122) and exterior wall (1132), securing element (1114) has interior wall (1124) and exterior wall (1134), securing element (1116) has interior wall (1126) and exterior wall (1136), and securing element (1118) has interior wall (1128) and exterior wall (1138). Each of the interior walls has a length extending from a base of the perimeter (1104) to a top surface of the wall. Furthermore, the securing elements (1112)-(1118) function as exterior barriers to form a circumference within which a heat dissipating device is received. The longitudinal walls (1142)-(1148) of each securing element (1102)-(1108), respectively, contribute to formation of a frame around the perimeter (1104) to ensure that the mechanical securing elements do not infringe within the planar area of the GA assembly (1100) configured to receive a heat dissipating device (not shown). More specifically, the heat dissipating device (not shown) is sized to fit within the circumference of the GA package (1100) formed by the securing elements (1112)-(1118).

Each longitudinal wall (1142)-(1148) has an interior surface and an exterior surface. The interior surface of each wall has threads (1152)-(1158) therein that are configured to receive complementary threads on an exterior circumferential wall of a heat dissipating device. The threads of the securing elements in combination with the complementary threads of the heat dissipating device function to hold the heat dissipating device in a stationary position relative to the GA assembly (1100).

Figure 12:
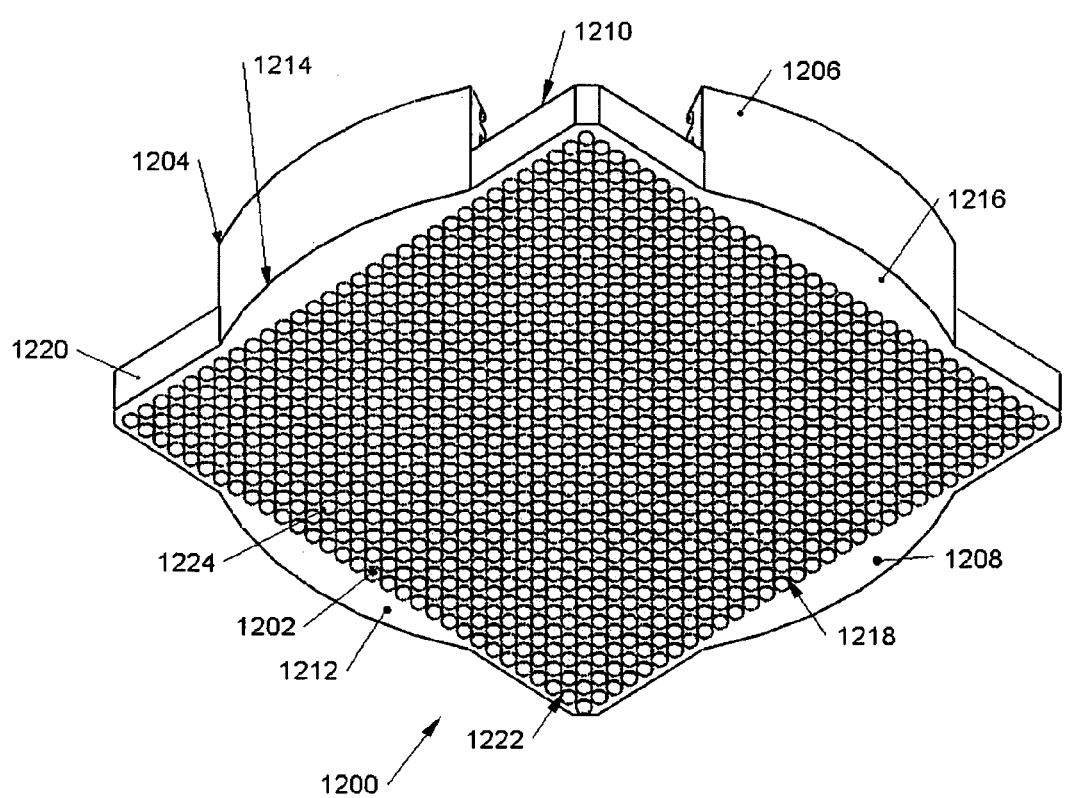
FIG. 12 is a bottom view of the GA package of FIG. 11.

FIG. 12 is a diagram (1200) of a bottom view of the GA package of FIG. 11. As shown, the bottom surface (1222) of the substrate (1220) is a ball grid array (1224). Each of the side securing elements (1202)-(1208) are mounted along the perimeter (1210) of the package (1200). As shown, the bottom surface (1222) includes multiple balls of solder (1224). The GA package (1200) is placed on a printed circuit board that carries copper pads in a pattern that matches the solder balls. The assembly is then heated causing the solder balls to soften. Surface tension causes the molten solder to hold the package in alignment with the circuit board, at the correct separation distance, while the solder cools and solidifies. As shown, a bottom surface (1212), (1214), (1216), and (1218) of each of the side securing elements (1202), (1204), (1206), and (1208), respectively, is flush with the bottom surface (1222) of the substrate (1220). The flush alignment ensures that the side securing elements (1202)-(1208) do not cause any interference with the BGA package.

Figure 13:
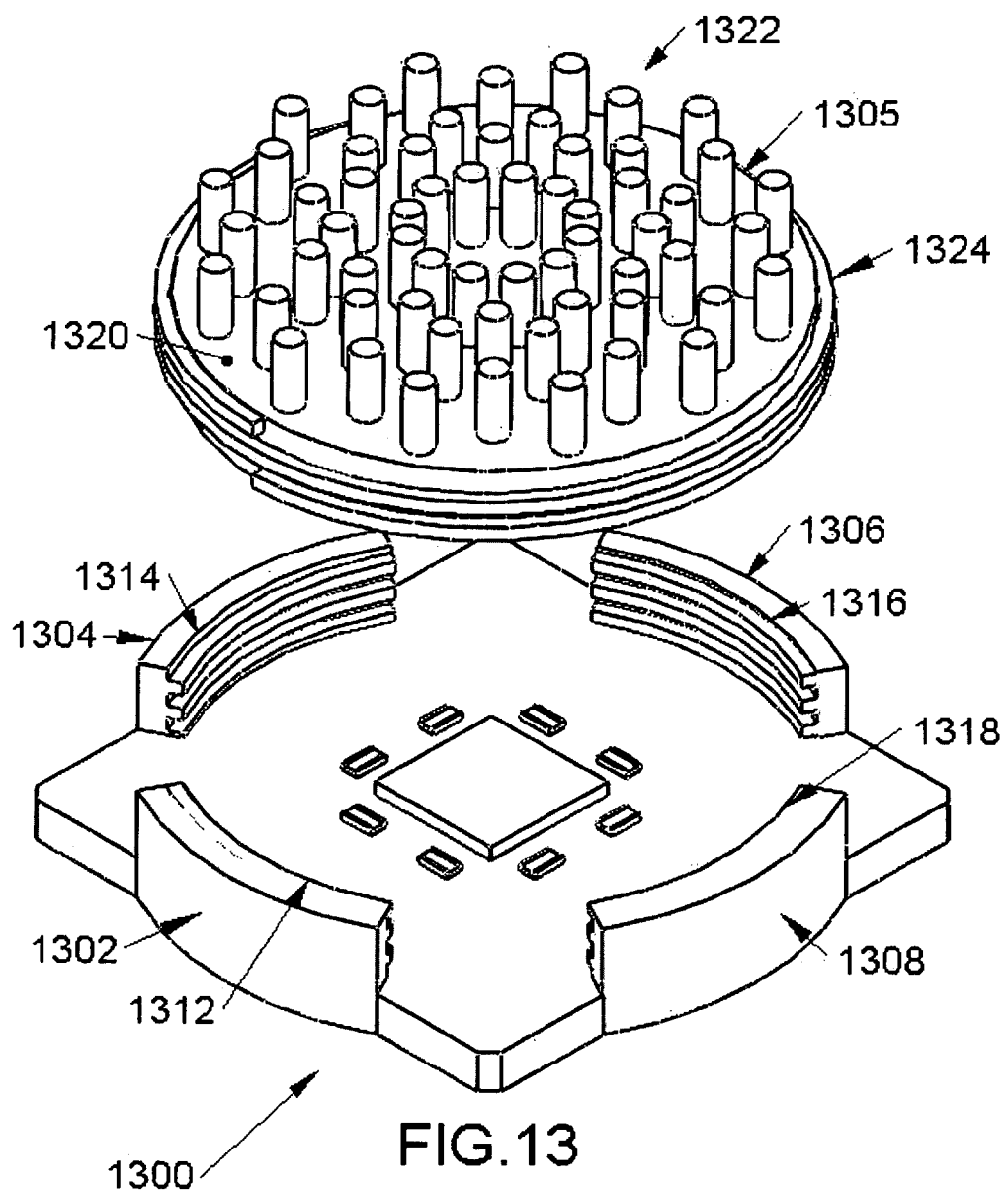
FIG. 13 is a perspective view of the GA package of FIG. 11 receiving a heat dissipating device.

FIG. 13 is a diagram of the GA assembly (1300) with a heat dissipating (1305) device being received by the GA assembly (1300). As shown, the heat dissipating device (1305) fits within the boundaries formed by the side securing elements (1302), (1304), (1306), and (1308). As shown above, the interior walls (1312), (1314), (1316), and (1318) of the side securing elements (1302)-(1308), respectively, are threaded and are complementary to the exterior wall (1324) of the circumference of the heat dissipating device (1305). The heat dissipating device (1305) is threadedly received by the side securing elements (1302)-(1308). In one embodiment, the heat dissipating device (1305) is rotated in a clockwise direction to attach to the side securing elements (1302)-(1308). However, the invention should not be limited to the clockwise direction, as in one embodiment, the heat dissipating device (1305) is rotated in a counter-clockwise direction to attach to the side securing elements (1302)-(1308). The heat dissipating device (1305) has a top planar surface (1320) formed within a circumference formed by the side grip elements (1302)-(1308). The fin field extends vertically from the base of the heat dissipating device (1305). In one embodiment, the area of the fin field is not limited to the planar surface (1320). Similarly, in one embodiment, the area of the base of the heat dissipating device is not limited to the planar area formed by the circumference of the side grip element, and the base can extend beyond the perimeter of the package (1300). A fin field (1322) is mounted on the planar surface (1320). Each fin in the fin field has a longitudinal extension with a bottom surface of each fin mounted to the planar surface (1320). Accordingly, the base of the heat dissipating device is secured to the GA assembly through a threaded receiving mechanism, with the fin field of the heat dissipating device extending in a longitudinal direction perpendicular to the plane of the threads.

Figure 14:
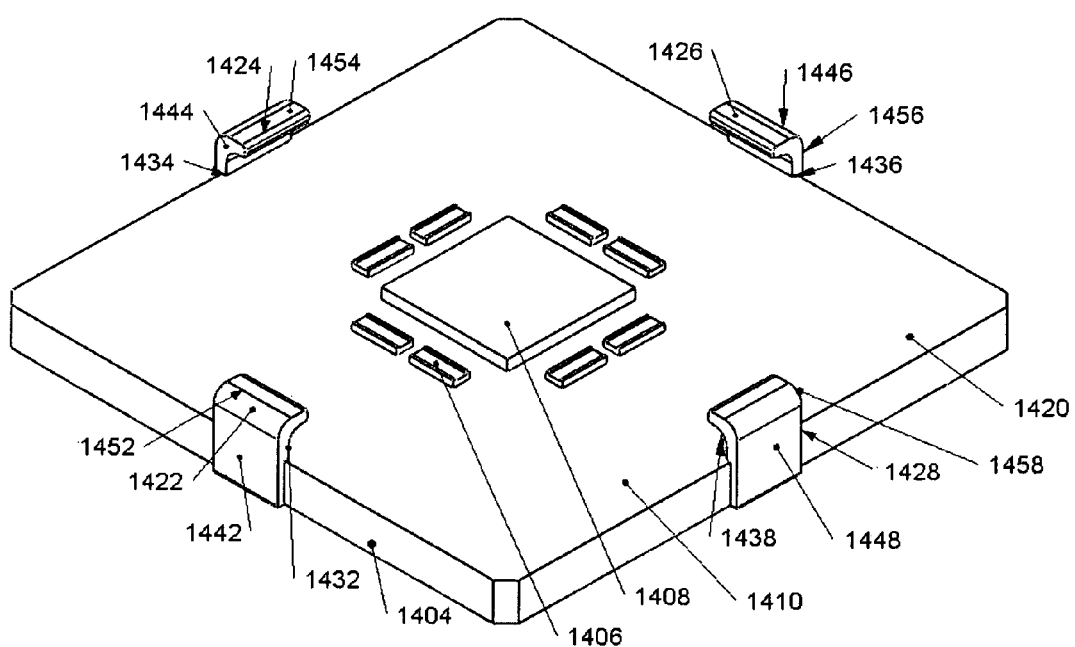
FIG. 14 is a diagram of a yet further embodiment of a GA package with multiple securing elements to secure a heat dissipating device to the package.

FIG. 14 is a perspective view of a modified GA assembly (1400) to receive a heat dissipating device. The GA assembly (1400) has a perimeter (1404) with at least one chip (1408) and one capacitor (1406) mounted on a substrate (1410) of the assembly (1100). As shown, the GA assembly has a perimeter (1420) with multiple securing elements (1422), (1424), (1426), and (1428) to secure a detachable object to the package. In one embodiment, the securing elements are molded into the GA assembly. As shown, the perimeter (1420) resembles a parallelogram with a single securing element on each side of the perimeter. In one embodiment, there may be two oppositely mounted securing elements, or multiple securing elements on each side of the perimeter. As shown herein, there is a single securing element along each side of the perimeter (1420). A first set includes securing elements (1422) and (1426) are disposed on opposite sides of the BGA assembly (1400). A second set includes securing elements (1424) and (1428) disposed on opposite sides of the GA package (1400), and on different sides than securing elements (1422) and (1426). Although two sets of securing elements with two securing elements in each set are shown, the invention should not be limited to the quantity of sets or the quantity of elements in each set. In one embodiment, a larger quantity of grip elements or a smaller quantity of securing elements may be provided.

Each of the securing elements (1422), (1424), (1426), and (1428) are mounted adjacent to the perimeter (1420) and extend longitudinally from a base of the BGA package (1400). More specifically, securing element (1422) has interior wall (1432) and exterior wall (1442), securing element (1424) has interior wall (1434) and exterior wall (1444), securing element (1426) has interior wall (1436) and exterior wall (1446), and securing element (1428) has interior wall (1438) and exterior wall (1448). Each of the interior walls has a length extending from a base of the substrate (1410) to a top surface of the respective wall. The exterior wall of each securing element may be flat or profiled. However, the interior wall of each securing element is profiled in a novel manner to form a frame around the perimeter (1420) to receive and secure a heat dissipating device (not shown) to the GA (1400). More specifically, the heat dissipating device (not shown) is sized to fit within the perimeter (1420) formed by the interior walls of the multiple securing elements of the GA package (1400).

As shown, a top portion of each securing element includes a profiled extension. More specifically, securing element (1422) has profiled extension (1452), securing element (1424) has profiled extension (1454), securing element (1426) has profile extension (1456), and securing element (1428) has profiled extension (1458). Each profiled extension is configured to receive a complementary profile opening on an exterior wall of a heat dissipating device. The complementary configuration of the profiled extension is sized to be received by the profile opening along a perimeter of a heat dissipating device.

Figure 15:
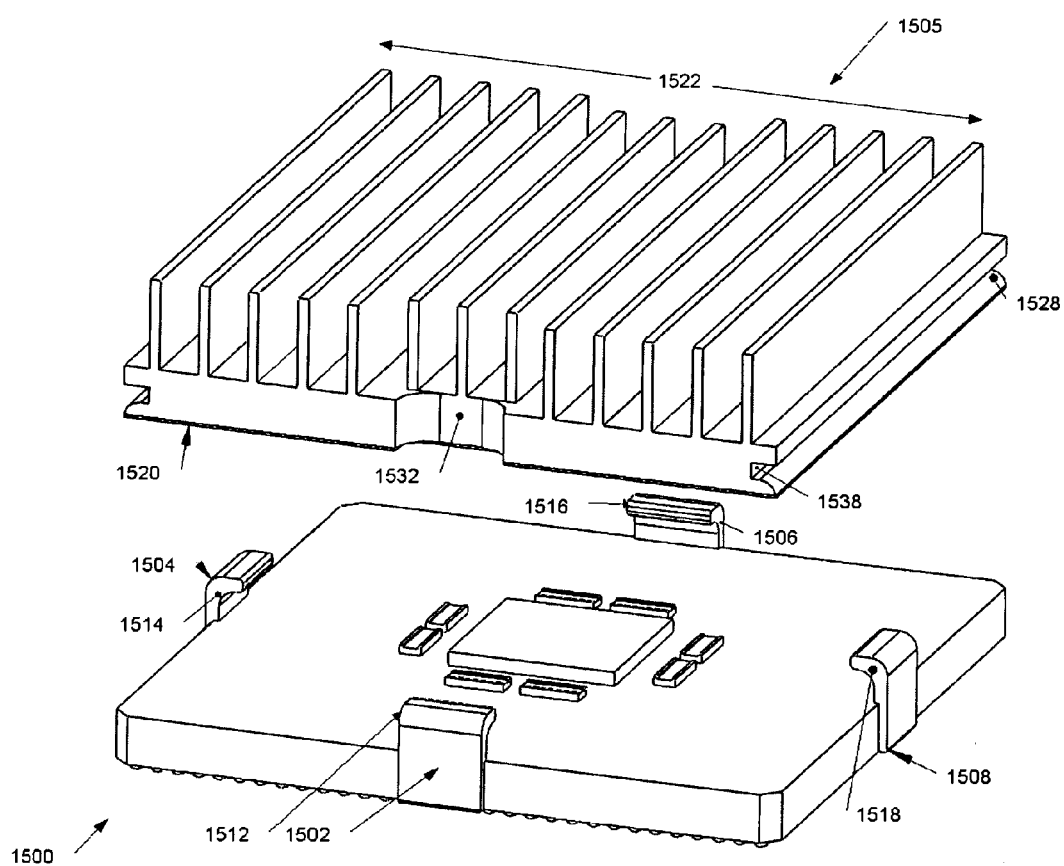
FIG. 15 is a perspective view of the GA package of FIG. 14 receiving a heat dissipating device.

FIG. 15 is a diagram of a GA assembly (1500) with a heat dissipating device (1505) being received by the GA assembly (1500) with the configuration of the profiled securing elements shown in FIG. 14. As shown, the heat dissipating device (1505) fits within the boundaries formed by the side securing elements (1502)-(1508). There may be additional securing elements along other portions of the perimeter of the GA assembly, but they are not shown in this Figure. As shown above, the top portion of the securing elements each have a profiled extension (1512)-(1518), respectively. Each profiled extension extends within the confines of the perimeter and are received by a complementary indentation formed in the base of the heat dissipating device (1505). As shown, the heat dissipated device (1505) has a base (1520) and a plurality of fins that form a fin field (1522). In one embodiment, only one of the profiled extensions is received by the heat dissipating device (1505). As shown herein, the base (1520) of the heat dissipating device is a planar surface with the shape of a four sided polygon. Other polygon shapes may be used for the GA assembly and/or base of a heat dissipating device. As such, the invention should not be limited to the geometric shape shown herein. One of the sides (1528) of the base (1520) of the heat dissipating device (1505) has an indentation (1538) that is sized to receive the profiled extension (1518) of the associated securing element (1508). In contrast, the base (1520) of the heat dissipating device (1505) is shown with a cut-out (1532) as a detachment of the profiled extension (1512) from the associated securing element (1502). Accordingly, the fin field (1522) of the heat dissipating device (1505) is secured to the GA assembly (1500) through a profiled extension with a complementary profiled indentation in the based of the heat dissipating device that is sized to receive and hold the profile extension.

Advantages Over The Prior Art

The embodiments illustrated herein present a structure for securing a heat dissipating device to an integrated electronic package. As such, the securing elements are integrated into the electronic package and are not a component of a socket assembly. In addition, the proposed embodiments eliminate the need to secure the heat dissipating device to the PWB, i.e., PCB. This will free up valuable real estate on the PCB for routing purposes. Since the attachment is part of the electronic package itself, significant cost savings are realized due to less number of parts and reducing the manufacturing durations for assembly and attachment of the heat dissipating device.

The electronic package shown and claimed herein provides a chip in communication with supporting electronics mounted on a chip carrier. In one embodiment, the supporting electronic and chip carrier may be in the form of a capacitor and substrate. Furthermore as shown, the GA is a single package with a plurality of solder balls that when exposed to a melting temperature soften to secure to a secondary electronic surface. The aspect of employing solder enhances thermal and electrical performance of the GA in comparison to a socket assembly. Furthermore, integration of the protrusion(s) directly to the GA supports a direct anchor of a heat dissipating device to the package.

There is additional significant advantage gained as the result of this invention. Many prior art CPUs and ASICs require use of a heat spreading plate on top of the die for thermal management of the heat generating device. The heat spreading device is typically molded or glued to the package together with a thermal interface material placed between the heat spreader and the die, so called TIM1. Subsequently, the heat dissipating device is placed on top of the CPU or ASIC with a thermal interface material in between, so called TIM2. The heat spreader and thermal interface materials are required elements in the prior art for heat dissipation. The current invention eliminates the need for both the heat spreader and TIM2. Therefore, the embodiments shown herein significantly reduce the cost of the electronics package and facilitate the package thermal performance by removing two layers of material between the die and the heat dissipating device.

Alternative Embodiments

It will be appreciated that, although specific embodiments of the invention have been described herein for purposes of illustration, various modifications may be made without departing from the spirit and scope of the invention. In particular, the securing elements can protrude from a top surface of the GA within an interior surface area formed by the perimeter and provides a mechanism of attaching the heat dissipating device to the integrated electronic package. In this embodiment, the heat dissipating device would be configured to include an aperture or complementary element to the protrusion to attach the heat dissipating device to the GA. Furthermore, although the electronic package is described with solder balls for forming an electronic connection, the invention should not be limited to this disclosed element. In one embodiment, the solder balls may be replaced with pins or leads on a periphery, or an equivalent electronic and thermal connection element between the board and the assembly. Accordingly, the scope of protection of this invention is limited only by the following claims and their equivalents.

I claim:

1. A board mounted electronic package comprising:
   a chip in communication with supporting electronics mounted on a chip carrier having a plurality of leads for providing electrical and thermal connectivity to a printed circuit board; and
   at least one securing element protruding from a planar surface of the package to anchor a heat dissipating device to the package, the at least one securing element being an integral part of the package and absent attachment to the printed circuit board.

2. The package of claim 1, further comprising said securing element having an interior wall and an exterior wall, with one of the walls having a protrusion for receiving a secondary attachment device.

3. The package of claim 2, further comprising a spring clip size to fit within an interior formed by said periphery and received by a fin field of a received heat dissipating device, said clip having an extension at each end with an opening at each end, said opening sized to be received by said protrusion.

4. The package of claim 1, further comprising said securing element having two sections, a first section being an integral part of the exterior wall of a perimeter of said electronic package, and a second section rotatable secured to said first section.

5. The package of claim 4, further comprising a spring embedded into said second section to support a flex of said securing element away from said perimeter to receive a heat dissipating device, and a return of said securing element to a non-flexed position to secure said heat dissipating device to said grid assembly.

6. The package of claim 5, further comprising a horizontal projection securing to an interior wall of said second section, said horizontal projection sized to be received by a complementary opening in a heat dissipating device.

7. The package of claim 6, wherein the opening of the heat dissipating device is formed in a section selected from the group consisting of: the base and the fin field.

8. The package of claim 1, further comprising an aperture formed in said securing element.

9. The package of claim 8, further comprising a mechanical securing element size to fit in said aperture and to secure said heat dissipating device directly to said assembly.

10. The package of claim 1, further comprising said securing element having a convex shape and an interior wall with a threaded profile.

11. The package of claim 10, further comprising a base of a heat dissipating device having a profile shaped and sized to be received by the securing element, and having an exterior base-wall with a threaded profile.

12. The package of claim 11, wherein said threaded profile of said securing element and said heat dissipating device are complementary to secure said heat dissipating device to said assembly.

13. The package of claim 2, wherein said extension crosses a plane of said perimeter and is sized to be received by a complementary indentation formed in a received heat dissipating device, to secure said heat dissipating device to said assembly.

14. A board mounted electronic package comprising:
 a chip in communication with supporting electronics mounted on a chip carrier having a plurality of leads to provide electrical and thermal connectivity to a printed circuit board;
 a first securing element protruding from a planar surface of the package, said first securing element configured to receive a second complementary securing element from a heat dissipating device, to anchor the heat dissipating device to the package, the first securing element being an integral part of the package and absent attachment to the printed circuit board.

15. The package of claim 14, wherein said first securing element is mounted on a perimeter of the planar surface and a base of the heat dissipating device is sized to be received within the perimeter.

\* \* \* \* \*